United States Patent
Okayasu

[11] Patent Number: 6,157,200
[45] Date of Patent: Dec. 5, 2000

[54] INTEGRATED CIRCUIT DEVICE TESTER

[75] Inventor: Toshiyuki Okayasu, Kitakasushika-gun, Japan

[73] Assignee: Advantest Corporation, Tokyo, Japan

[21] Appl. No.: 09/101,429
[22] PCT Filed: Nov. 13, 1997
[86] PCT No.: PCT/JP97/04130
   § 371 Date: Jul. 8, 1998
   § 102(e) Date: Jul. 8, 1998
[87] PCT Pub. No.: WO98/22829
   PCT Pub. Date: May 28, 1998

[30] Foreign Application Priority Data

Nov. 15, 1996 [JP] Japan ................................. 8-304933

[51] Int. Cl.$^7$ ................................................. G01R 19/00
[52] U.S. Cl. ........................................... 324/753; 324/765
[58] Field of Search .................................. 324/750, 751, 324/753, 765; 702/119, 118; 359/170; 250/310, 311; 257/40, 48; 438/17, 14

[56] References Cited

U.S. PATENT DOCUMENTS

| | | |
|---|---|---|
| 4,517,512 | 5/1985 | Petrich et al. . |
| 4,875,006 | 10/1989 | Henley et al. ............................. 324/96 |
| 5,095,262 | 3/1992 | Henley et al. ......................... 324/73.1 |
| 5,477,139 | 12/1995 | West et al. . |
| 5,946,250 | 8/1999 | Suzuki .................................... 365/201 |

FOREIGN PATENT DOCUMENTS

| | | |
|---|---|---|
| 59-500891 | 5/1984 | Japan . |
| 60-219571 | 11/1985 | Japan . |
| 61-117472 | 6/1986 | Japan . |
| 2-66476 | 3/1990 | Japan . |
| 5273315 | 3/1990 | Japan . |
| 3-65987 | 6/1991 | Japan . |
| 3-269376 | 11/1991 | Japan . |
| 2066476 | 10/1993 | Japan . |
| 9-281195 | 10/1997 | Japan . |
| 83/04315 | 12/1983 | WIPO . |

Primary Examiner—Vinh P. Nguyen
Attorney, Agent, or Firm—Gallagher & Lathrop; Timothy J. Lane

[57] ABSTRACT

In an IC device tester for testing IC devices held in contact with a test head, optical signals are employed for all signal exchanges between a tester mainframe and the test head and signal transmission lines therebetween are all formed by optical fibers, whereby the cable group interconnecting the tester mainframe and the test head can be made small in diameter and can be extended as required.

13 Claims, 11 Drawing Sheets

INTEGRATED CIRCUIT DEVICE TESTER

BACKGROUND OF THE INVENTION

The present invention relates to an integrated circuit device tester for testing semiconductor integrated circuit devices (ICs) or large-scale integrated circuit devices (LSIs).

Figure 1:
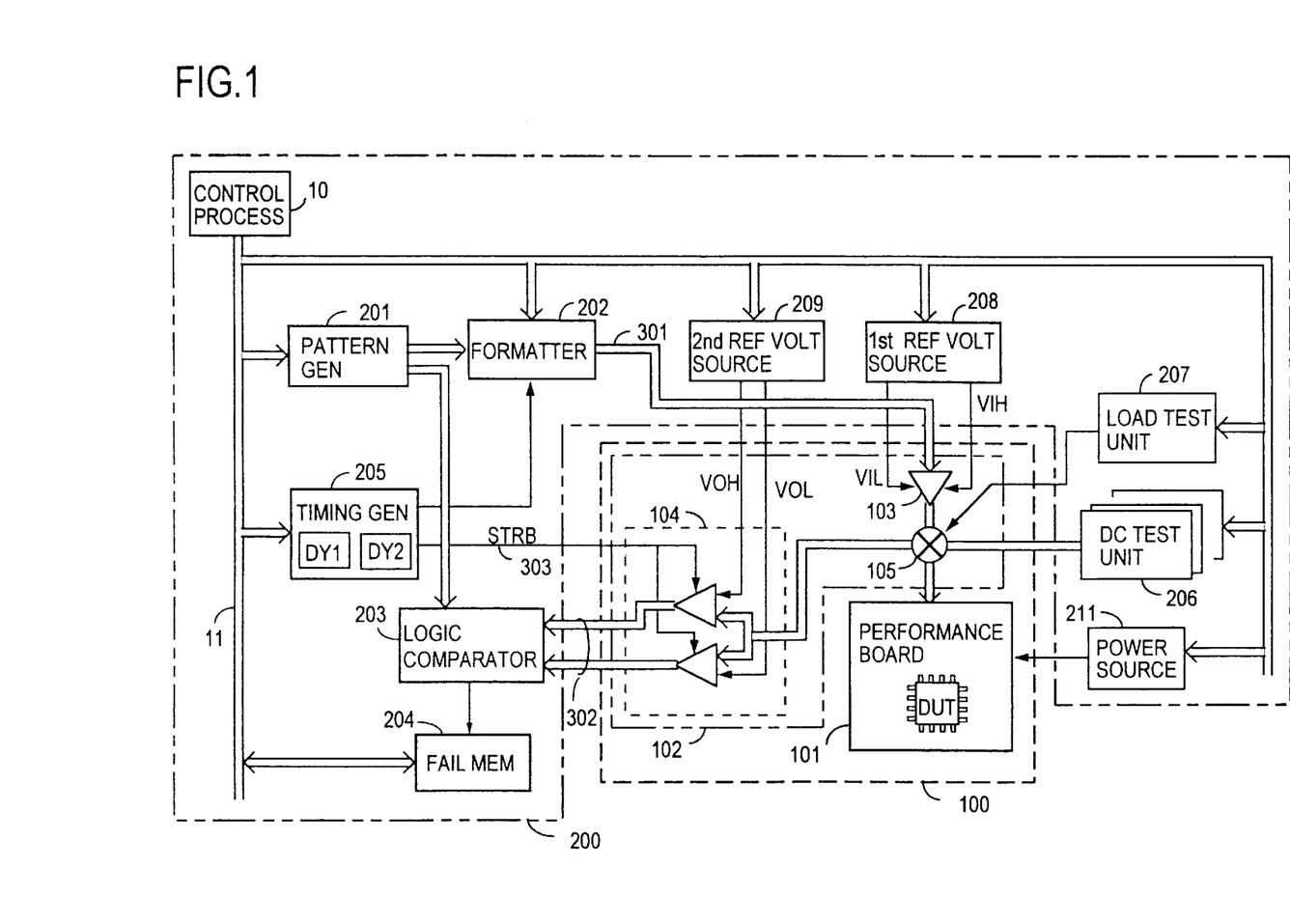
FIG. 1 is a block diagram for explaining the prior art.

In FIG. 1 there is shown in block form the general configuration of an integrated circuit device tester in wide use. Reference numeral 100 denotes a test head and 200 a tester main frame. The test head 100 has a performance board 101 and a pin electronics 102 mounted thereon. The performance board 101 has a socket (not shown in particular) for contact with a device under test (hereinafter referred to as a DUT) to establish therethrough electric connections between it and the tester.

The pin electronics 102 has a driver group 103 for electrically driving the DUT, an analog comparator group 104 for checking response output signals read out of the DUT to determine if their H and L logic have normal voltage values, and a relay matrix 105 for switching the device groups that are connected to respective terminals of the DUT.

The tester main frame has a pattern generator 201, from which test pattern data (a digital signal) is output. The test pattern data and a timing edge signal from a timing generator are applied to a formatter 202, by which a pattern signal (a signal having an analog waveform) to be applied to each terminal of the DUT is generated. The pattern signal is provided via a pattern transmission line 301 to the test head 100, wherein it is applied via the driver group 103 to each terminals of the DUT. Incidentally, a timing signal is also contained in the pattern signal that is sent over the pattern transmission line 103.

The comparison results by the analog comparator group 104 are sent via response signal transmission lines 302 back to the tester main frame 200, wherein they are logically compared by a logical comparator 203 with expectation patterns from the pattern generator 201 to detect a mismatch between them and consequently a failing part. Reference numeral 204 denotes a failure memory, in which upon each detection of a mismatch by the logical comparator 203, H or L logic representing a failure is written at an address where the failure occurred.

Reference numeral 205 denotes a timing generator. As regards the timing generator 205, the presence of a coarse delay circuit DY1 and a fine delay circuit DY2 will be described first, for convenience of describing later on that, according to the present invention, they are separately provided in the tester main frame 200 and the test head 100, respectively.

Figure 2:
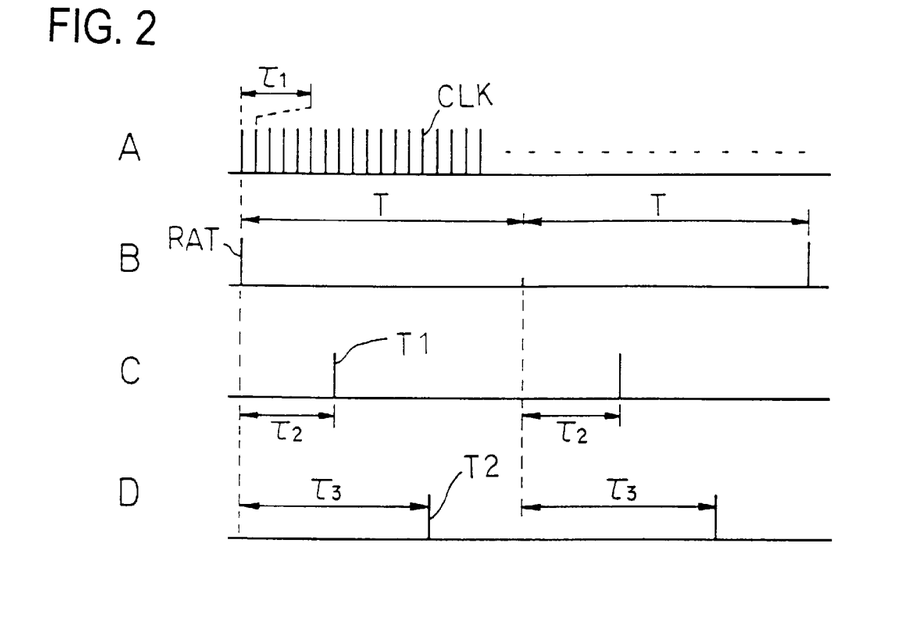
FIG. 2 is a waveform diagram for explaining the operation of the prior art.

Conventionally, the timing generator 204 frequency-divides a reference clock CLK, shown in FIG. 2, Row A, to obtain a rate pulse RAT (FIG. 2, Row B) that determines the test period or cycle T; besides, the timing generator 204 delays the rate pulse RAT by arbitrary time intervals to generate various timing signals such as the rise and fall timing of the test pattern signal waveform, the strobe timing of the analog comparator group 104 and the timing for the comparing operation of the logic comparator 203.

Accordingly, the timing generator 202 has a number of delay circuits by which the rate pulse RATE can be delayed for arbitrary periods of time within the range of the test period T or within a several-fold range; these delay circuits are used to generate various timing signals which are delayed behind the reference timing by arbitrary time intervals, such as timing signals T1 and T2 shown in FIG. 2, Rows C and D.

These delay circuits in the timing generator 205 are formed by combinations of coarse delay circuits DY1 each of which counts the clock pulses CLK and provides a delay time in units of the period $\tau 1$ of the clock CLK and fine delay circuits DY2 each of which subdivides the range of the period $\tau 1$ of the clock CLK to define a delay time; these delay circuits define the rise and fall timing of the test pattern signal by resolution on the order of picoseconds, for instance.

The tester main frame 200 further includes a DC test unit 206, a load test unit 207, a first reference voltage source 208 for setting voltage values VIH and VIL of H and L logic of the pattern signal, a second reference voltage source 209 for supplying comparison voltages VOH and VOL to the analog comparator group 104, and a power supply unit 211 for applying voltage to the DUT for operation. The setting and operation of the DC test unit 206, the load test unit 207, the first and second reference voltage sources 208 and 209 and the power supply unit 211 are controlled entirely by a control processor 10 via a control bus 11, together with setting and operation of the pattern generator 201, the formatter 202, the failure memory 204 and the timing generator 205.

Figure 3:
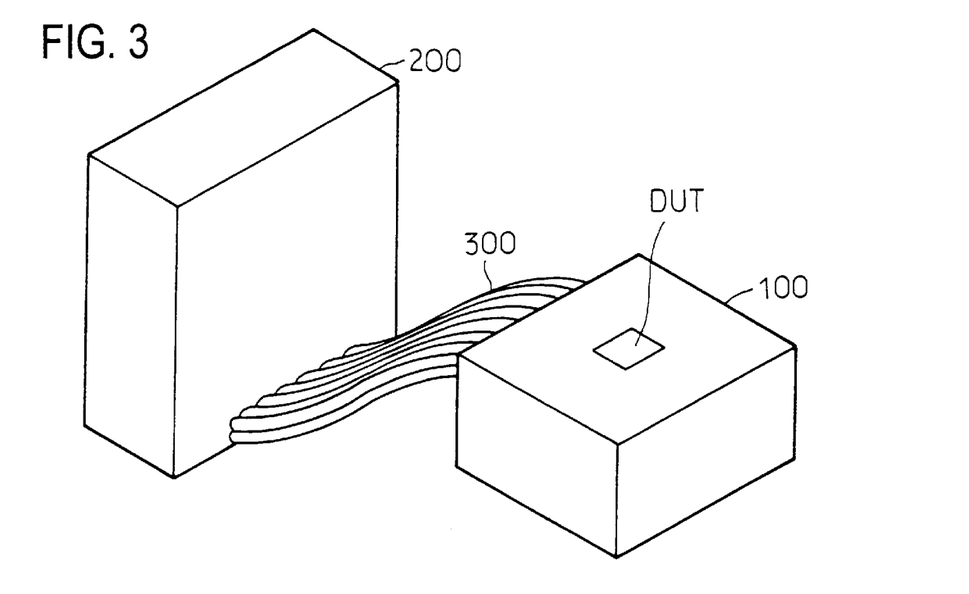
FIG. 3 is a perspective view for explaining the prior art.

FIG. 3 schematically shows the connection between the test head 100 and the tester main frame 200. The tester main frame 200 and the test head 100 are interconnected via a cable group 300. Since the tester main frame 200 and the test head 100 are interconnected via various signals lines as referred to previously with reference to FIG. 1, the number of cables housed in the cable group 300 is large.

There is a tendency that the number of IC terminals increases with an increase in the integration density of ICs. The speeding-up of IC operations also causes an increase in the number of cables of the cable group 300 that interconnects the tester main frame 200 and the test head 100. In a tester having a test capacity corresponding to, for example, 1000 IC terminals, the number of signals that are exchanged between the tester main frame 200 and the test head 100 is as large as tens of thousands; in addition, since twisted-pair, coaxial, multi-sealed and similar special cables are used taking into account high speed, high accuracy, noise resistance and so forth, the actual number of conductors is several times larger than the number of signals handled and the cable group 300 forms a big bundle accordingly, making it difficult to move the test head 100 (for mounting thereon or dismounting therefrom a handler, for instance).

Another disadvantage of the prior art is that even a slight increase in the length of the cable group 300 causes crosstalk between the cables, resulting in the test accuracy being impaired. Moreover, the transmission of such a large number of signals consumes much power, which means an increase in the amount of heat generated and hence makes cooling hard, and the number of terminating resistors also increases. These factors constitute an obstacle to downsizing of the system.

SUMMARY OF THE INVENTION

It is therefore an object of the present invention to provide an integrated circuit device tester which permits suppression of crosstalk between signals as well as allows ease in handling the test head through minimization of the cable group interconnecting the tester mainframe and the test head.

According to the present invention, there is provided an IC device tester which, under the control of a control processor, generates pattern data and expectation data by a pattern generator, formats the pattern data by a formatter into a predetermined pattern waveform, applies the pattern waveform by a driver to an IC device under test at a reference voltage, compares the response signal from the IC device under test by an analog comparator with a reference logical level to make a logical decision, compares the decided logic by a logic comparator with the expectation data from the pattern generator to decide whether or not the IC under test is defective or nondefective, and writes failure data in a failure memory. The IC device tester comprises:

- a tester mainframe provided with the control processor;
- first serial data transceiver means provided in the tester mainframe, for outputting data, as serial data, which is used to set the reference voltage for the driver and the reference logical level for the analog comparator;
- electro-optic converter means provided in the tester mainframe, for converting the serial data to a lightwave signal;
- a test head provided with the driver for applying a test pattern to the IC device under test and an analog comparator for deciding the logic of its response;
- opto-electric converter means provided in the test head, for converting the lightwave signal to electrical serial data;
- second serial data transceiver means provided in the test head, for converting the serial data to parallel reference voltage data and parallel reference logical level data;
- D/A converter means for converting the parallel reference voltage data and the parallel reference logical level data to an analog reference voltage and a reference logical level and for setting them in the analog comparator and the logic comparator, respectively; and
- optical fiber means for interconnecting the electro-optic converter means and the opto-electric converter means.

According to the present invention, it is possible to employ a configuration wherein data or various timing signals set for each IC terminal, which are sent from the tester mainframe to the test head, are transmitted as optical serial signal, received and converted by the serial data transceiver means in the test head into parallel signals for storage in setting register means, and measured data and measured results are sent as lightwave signals back to the tester mainframe.

According to the present invention, the test head is further provided with a pattern memory and a formatter and digital test pattern data by the pattern generator is sent as an optical serial signal to the test head for storage in the pattern memory. At the same time as the test starts, the test pattern data stored in the pattern memory is read out therefrom, then the read-out test pattern data (a digital signal) is formatted by the formatter to an analog pattern signal, and the pattern signal is applied via the driver to the IC device under test.

With the configuration of the present invention, the optical transmission line is about 200 to 500 m$\mu\phi$ in diameter even if a plastic optical fiber is used therefor, and unlike in the case of transmitting electric signals, a two-way conductor is not needed for each channel; hence, the signal transmission line can be reduced in diameter and in weight. With the configuration that transmits and receives optical serial signals, the number of optical fibers used can be made particularly small and the cable group can be made further small-diametered and lightweight. Moreover, since the optical fiber transmits light only along its central portion, no crosstalk occurs. Accordingly, the length of cable group can be made long.

DETAILED DESCRIPTION OF THE PREFERRED EMBODIMENTS

Figure 4:
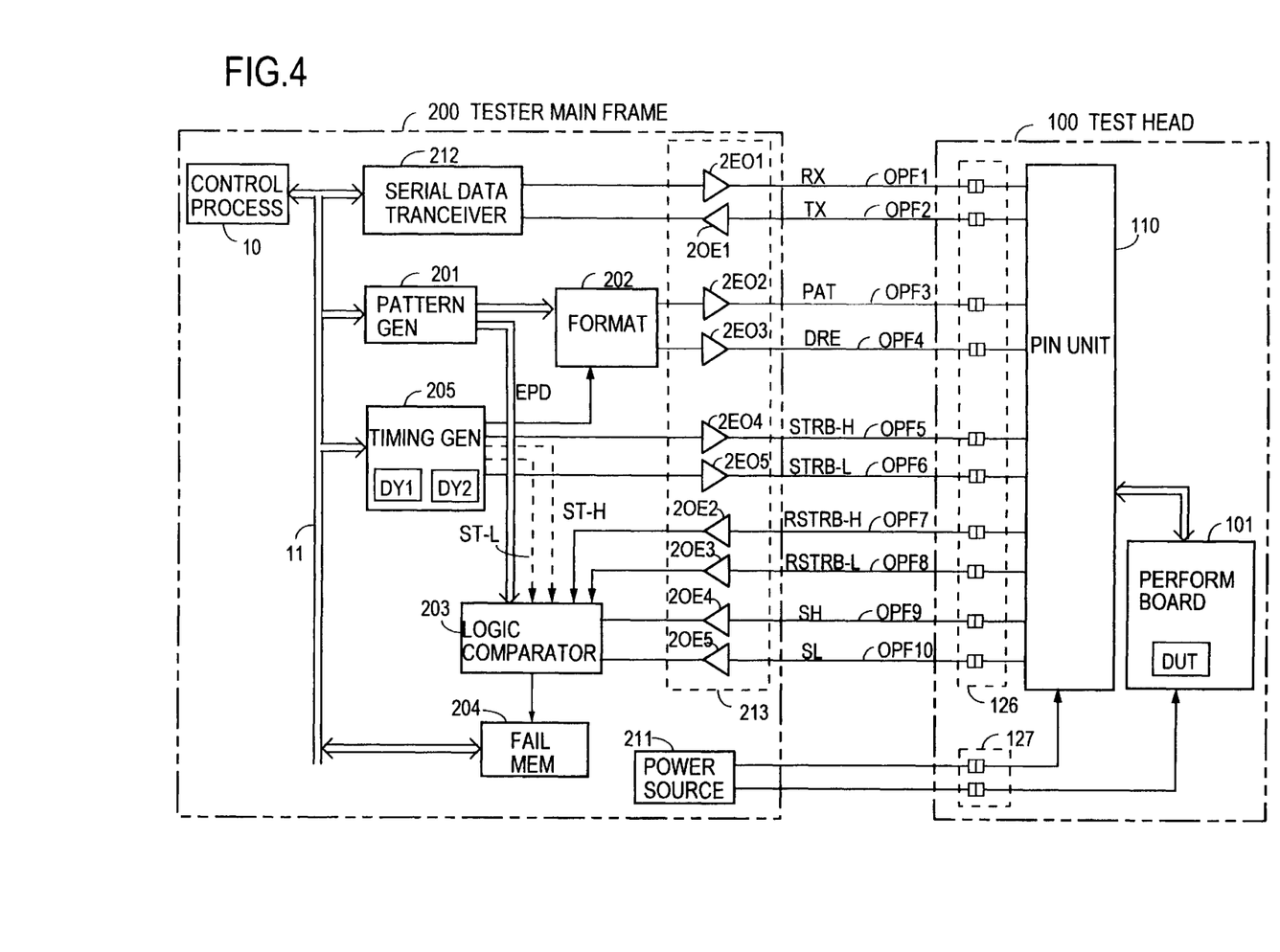
FIG. 4 is a block diagram illustrating an embodiment of the present invention.

FIG. 4 illustrates in block form an embodiment of the IC device tester according to the present invention. The present invention uses an optical fiber cable and a power supply wire cable to interconnect the tester mainframe 200 and the test head 100. The use of the optical fiber cables permits transfer of various test data, transfer of various set data and transmission of various timing signals. By limiting the use of the wire cable only to power supply and by using the optical fiber cable for as many connections as possible, the volume of the connection cable between the tester mainframe 200 and the test head 100 can be reduced.

In this embodiment, the DC test unit 206, the load test unit 207 and the first reference voltage source 208 provided in the tester mainframe 200 in FIG. 1 are shifted as their counterparts to the test head 100, and a serial data transceiver 212 and an optical input/output (I/O) module 213 are provided in the tester mainframe 200. On the other hand, a pin unit 110 is provided in the test head 100 as will be described later on with reference to FIG. 5. The pin unit 110 is equipped with the functions of the DC test unit, the load test unit and the first reference voltage source as well as pin electronics. The optical I/O module 213 has electro-optic converters 2EO1 to 2EO5 and opto-electric converters 2OE1 to 2OE5. The optical I/O module 213 is connected to the pin unit 110 of the test head 100 via optical fibers OPF1 to OPF10 and an optical coupling part 126.

The serial data transceiver 212 outputs and provides various set voltage data, load test conditions, DC test set data, relay matrix control data, etc. to the electro-optic converter 2EO1 and receives via the opto-electric converter 2OE1 DC test result data TX from the test head 100. The formatter 202 formats the test data pattern fed thereto into a predetermined form and provides it to the test head 100 via the electro-optic converter 2EO2. The timing generator 205 applies a timing edge signal to the formatter 202 and generates and sends strobe signals STRB-H and STRB-L to the electro-optic converters 2EO4 and 2EO5, from which they are applied as optical strobe signals to the test head 100.

The logic comparator 203 receives the test results (logical data obtained by deciding the results of analog comparison at the strobe timing) from the test head 100 converted by the opto-electric converters 2OE4 and 2OE5 into electric signals, then compares them with expectation data EPD to decide whether or not the IC device under test (hereinafter referred to as a DUT) is nondefective, and write failure data in the failure memory 204.

Figure 5:
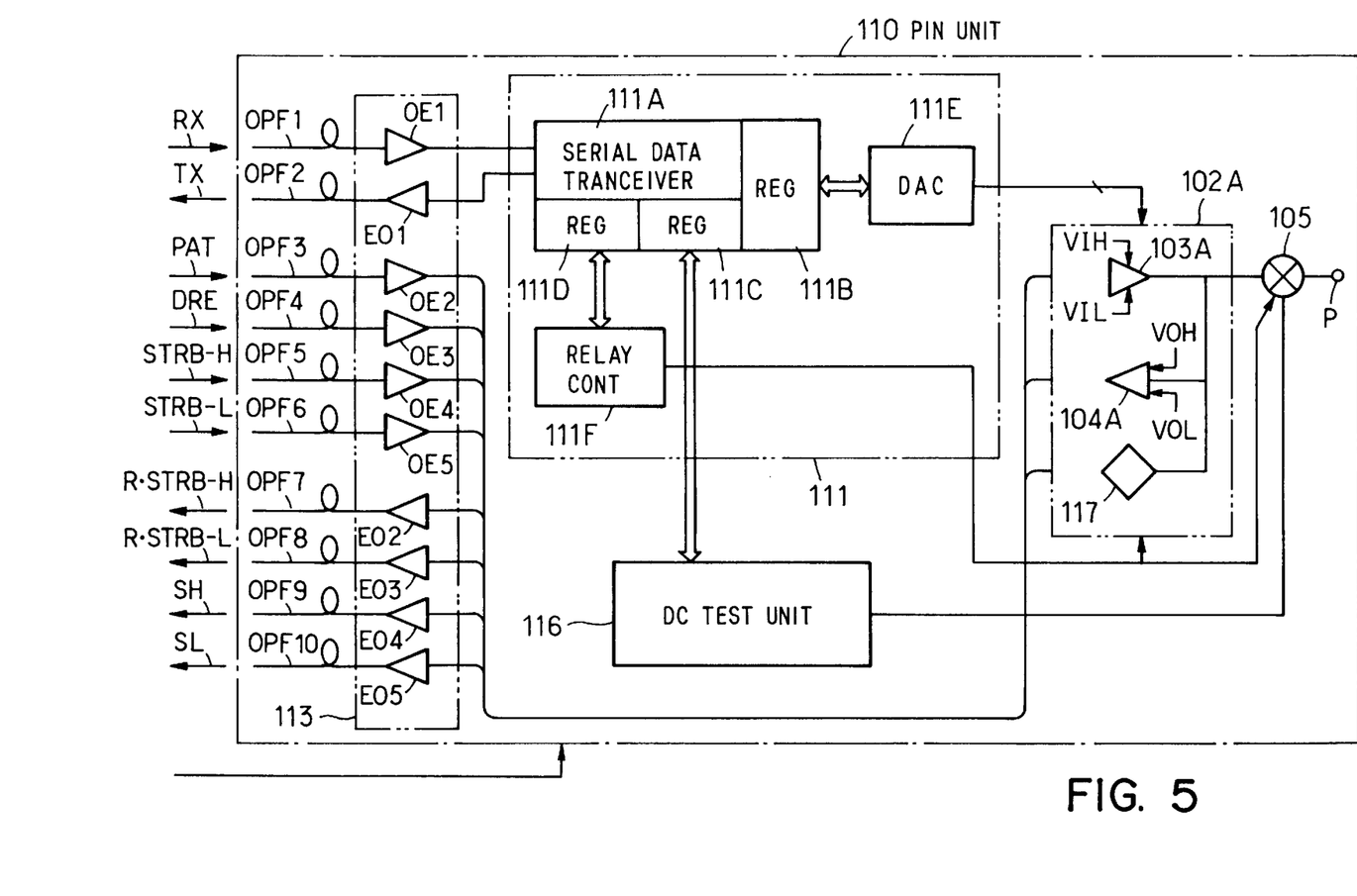
FIG. 5 is a block diagram illustrating an example of the pin unit configuration in FIG. 4.

FIG. 5 illustrates in block form the configuration of the pin unit 110 in the FIG. 4 embodiment, which supplies a pattern signal to one terminal P of the DUT and makes an analog comparison of a signal output from the terminal P and sends the comparison result to the test mainframe 200.

The pin unit 110 comprises, in this example, a pin electronics 102A loaded with a driver 103A for driving one terminal P of the DUT, an analog comparator 104A and a load test circuit 117, a relay matrix 105, a local pin controller 111, a DC test unit 116 and an optical I/O module 113.

The optical I/O module 113 has opto-electric converters OE1 to OE5 and electro-optic converters EO1 to EO5 and converts optical signals from the tester mainframe 200 by the opto-electric converters OE1 to OE5 into electric signals, which are used to run functional and DC tests.

The local pin controller 111 is made up of: a serial data transceiver 111A for receiving a serial signal sent from the optical fiber OPF1 via the opto-electric converter OE1; register groups 111B, 111C and 111D which read therein serial data for various setting, received by the serial data transceiver 111A, and output it as parallel data for various setting use; a D/A converter 11E for generating from the setting data, for example, voltages VIH and VIL for the driver 103A and comparison voltages VOH and VOL for the analog comparator 104A; and a relay control circuit 111F for controlling the relay matrix 105 based on the parallel data for relay control use from the register group 111D.

That is to say, voltage values of the voltage VIH of H logic and the voltage VIL of L logic for the driver 103A and the comparison voltages VOH and VOL for the analog comparator 104A are stored in the register group 111B, from which they are provided as parallel data to the D/A converter 111E for conversion into analog voltage values, which are provided to the driver 103A and the analog comparator 104A. Further, test conditions for operating the load test circuit 117 are also stored in the register group 111B, and the data read in the register group 111B is used for the load test, too.

Stored in the register group 111C are control signals necessary for the DC test which, for example, in the test mode (voltage-applied current measuring mode/current-applied voltage measuring mode), control setting of the applied voltage/current value, setting of the measuring range, the start and stop of the measurements, and so on, and DC test results. As required, the test results are transmitted to the tester mainframe 200 after being sent via the serial data transceiver 111A to and converted by the electro-optic converter EO1 into an optical signal TX.

Stored in the register group 111D is a control signal for controlling the relay matrix 105. The control signal is input into the relay control circuit 111F to control the pin electronics 102A and the relay matrix 105 to put them in the state corresponding to the test mode being set. That is, during the operation test, the driver 103A and the analog comparator 104A are connected to the terminal P of the DUT and the DC test unit 116 is disconnected therefrom. During the DC test, the pin electronics 102A is disconnected from the pin P of the DUT but instead the DC unit 116 is connected thereto.

In this way, the local pin controller 111 sets in the register groups 111B, 111C and 111D the conditions to be set for each terminal P according to test modes. Since the data to be stored in the register groups 111B, 111C and 111D is sent as an optical serial signal RX, only one optical fiber OPF1 is enough as the transmission line therefor, and the optical signal RX sent over the optical fiber OPF1 is converted by the opto-electric converter OE1 to an electric signal, which is input into the serial data transceiver 111A.

In this example, the data for various setting, stored in the register groups 111B, 111C and 111D is read out therefrom, as required, and converted by the electro-optic converter EO1 into the optical signal TX, which is sent via the optical fiber OPF2 back to the tester mainframe 200, wherein a check is made to see if the tester is correctly set.

The optical fiber OPF3 forms a pattern signal transmission line, over which the pattern signal to be applied to the terminal P is sent as an optical signal PAT. The pattern signal PAT is converted by the opto-electric converter OE2 into an electric signal, which is applied to the driver 103A mounted in the pin electronics 102A and thence to the terminal P.

Transmitted over the optical fiber OPF4 is a driver control signal DRE which is used to control the state of the driver 103A during a functional test. In the case of taking out the response signal from the DUT, the output terminal of the driver 103A is controlled by the controlled signal DRE to be high-impedance so that the response output signal can effectively read into the analog comparator 104A.

The optical fibers OPF5 and OPF6 form transmission lines over which strobe pulses for defining the timing of comparison of H- and L-logic levels in the analog comparator 104A are sent as optical signals STRB-H and STRB-L, respectively. The optical signal STRB-H is a pulse for strobing the H-logic period of a signal that is read out of the DUT and the optical signal STRB-L a pulse for strobing the L-logic period of the read-out signal.

These optical signals STRB-H and STRB-L are converted by the opto-electric converters OE5 and OE6 into electric signals, which are applied as strobe pulses to the analog comparator 104A.

The optical fibers OPF7 and OPF8 form transmission lines over which strobe pulses are send back to the tester mainframe 200 from the test head 100. The strobe pulses RSTRB-H and RSTRB-L that are sent back to the tester mainframe 200 are given by the actual circuit arrangement a delay time during which they travel between the tester mainframe 200 and the analog comparator 104A and they are used as strobe pulses for a logic comparator provided in the tester mainframe 200. That is, the decision results from the analog comparator 104A are sent over the optical fibers OPF7 and OPF8 to the tester mainframe 200 after being converted to optical signals and input into the logical comparator; in this instance, to make the delay time of the transmission of the decision results and the delay time of the strobe pulses coincide with each other, the strobe pulses are made to travel between the tester mainframe 200 and the test head 100. The optical fibers OPF9 and OPF 10 serve as transmission lines over which the decision results from the analog comparator 104A, that is, the functional test results of the DUT in this example, are sent as SH and SL back to the tester mainframe 200.

As will be seen from the above, the embodiment of FIG. 4 permits implementation of signal exchanges between the tester mainframe 200 and the test head 100 by means of 10 optical fibers for each terminal P of the DUT. Even if plastic optical fiber of a relatively large diameter as of 500 m$\mu\phi$ is used, a bundle of 10 optical fibers is very small in diameter and even a bundle of as many as 10,000 optical fibers for 1,000 IC terminals is sufficiently smaller in diameter than the electric cable group 300 (see FIG. 3). While in the above the return strobe pulses RSTRB-H and RSTRB-L are used to provide the timing for comparison by the logic comparator 203, it is also possible to generate the logical comparison timing by the timing generator 205 and provide it to the logic comparator 203 as indicated by the broken line, in which case the optical fibers OPF7 and OPF8 are unnecessary and the number of optical fibers used can be reduced accordingly. Alternatively, it is possible to adopt a construction wherein a mere analog comparator with no latch function is used as the analog comparator 104A of the test head 100 and hence is caused to successively perform the comparison without applying thereto the strobes STRB-H and STRB-L, then the comparison results are sampled at the tester mainframe 200 side at the timing of the strobes STRB-H and STRB-L, and the sampled data is provided to the logic comparator 203.

Figure 6:
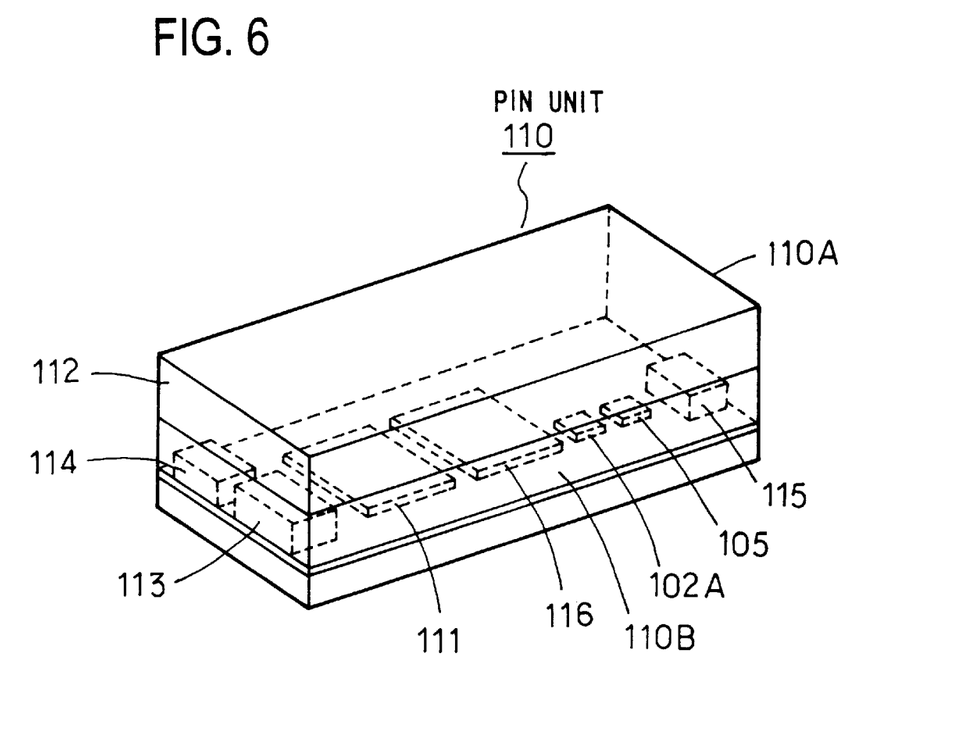
FIG. 6 is a perspective view for explaining an example of the pin unit structure used in the embodiment of FIG. 5.

FIG. 6 shows the structure of the pin unit 110 into which the respective components shown in FIG. 5 are assembled together for each pin of the DUT. On a wiring board 110B in the case 110A there are mounted an integrated circuit element forming the local pin controller 111, an integrated circuit element forming the DC test unit 116, the pin electronics 102A loaded with the driver 103A, the analog comparator 104A and the load test circuit 117, the relay matrix 105, the optical I/O module 113, an electrical connector 114 for power supply, and a connector 115 for connection to or disconnection from the performance board. Reference numeral 112 denotes a radiation block.

Figure 7:
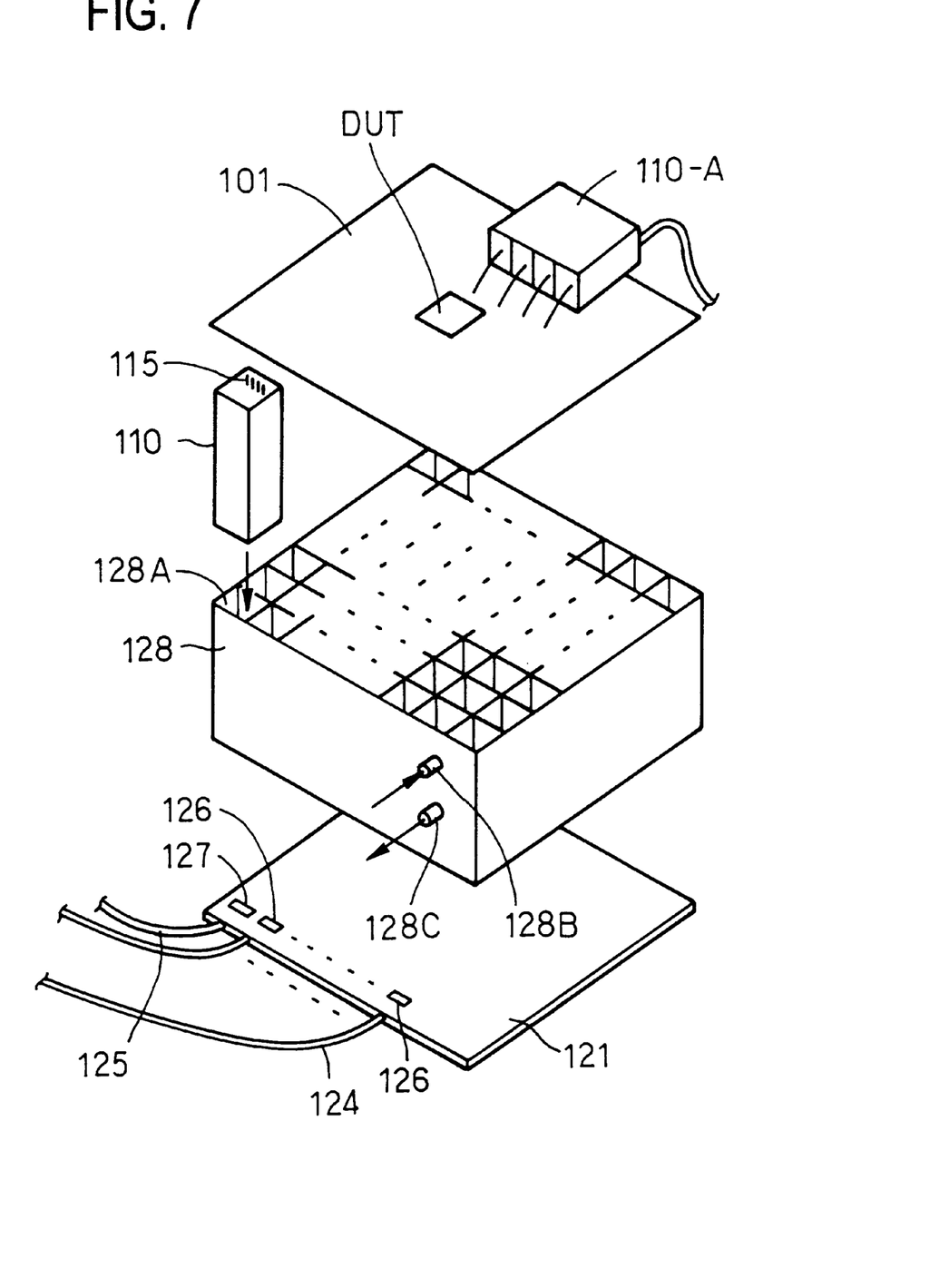
FIG. 7 is a perspective view for explaining an example of a structure for mounting the pin unit shown in FIG. 6.
Figure 8:
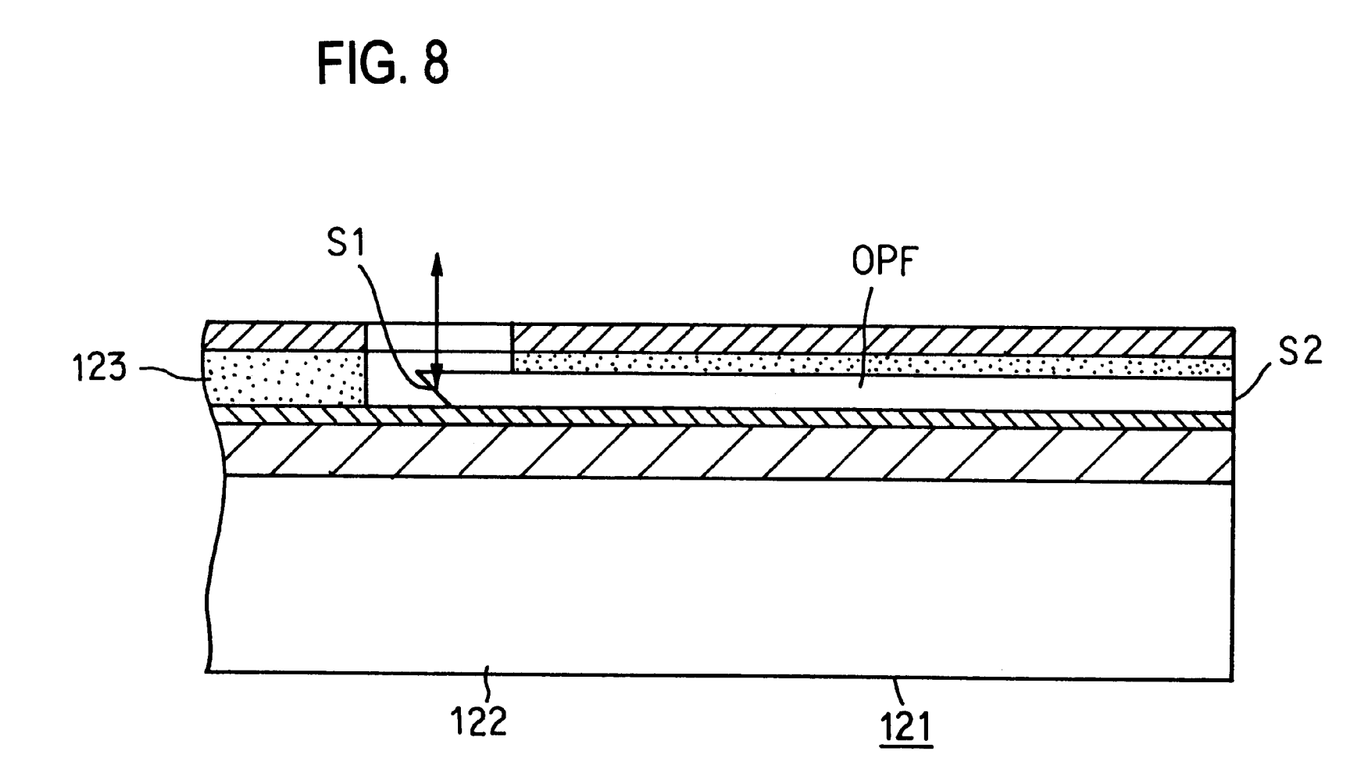
FIG. 8 is a sectional view for explaining an example of an opto-electric compound board depicted in FIG. 7.

FIG. 7 illustrates an example of a structure for mounting the pin unit 110 on the test head 100. Reference numeral 121 denotes an opto-electric compound board. The opto-electric compound board 121 has such a construction as shown in FIG. 8. A multi-layered electric wiring layer 122 has in its one surface an optical-fiber embedded layer 123 in which optical fibers OPF are embedded therein side by side with their inner ends cut at 45 degrees as indicated by S1; the oblique end face of each optical fiber is directed toward the electric wiring layer 122 so that light propagating over the optical fiber is reflected off in the direction perpendicular to the wiring board surface, and the optical I/O module 113 mounted in the pin unit 110 (FIG. 6) is placed in the direction of reflection to establish optical coupling between the optical fiber OPF and the optical I/O module 113 of the pin unit 110.

The optical fiber OPF has its other end exposed at the end face of the wiring board. By optically coupling an optical fiber cable 124 (see FIG. 7) extended from the tester mainframe 200 (not shown in particular in FIG. 7) to the exposed end face S2 of the optical fiber OPF, the tester mainframe 200 and the pin unit 110 provided at the side of the test head 100 can be connected via an optical transmission line. Incidentally, the electric connector 114 mounted in the pin unit 110 (FIG. 6) is electrically connected via an ordinary electric connection structure to the electric wiring layer 122, through which it is connected to the tester mainframe 200.

In FIG. 7, reference numeral 125 denotes an electric cable for power supply use which is extended from the tester mainframe 200, 126 an optical coupling part formed in the surface of the opto-electric compound board 121, and 127 an electric connector. By connecting the optical I/O module 113 and the electric connector 114 of the pin unit 110 to the optical coupling part 126 and the electric connector 127, respectively, the pin unit 110 is connected to the tester mainframe 200.

Large numbers of optical coupling parts 126 and electric connectors 127 are formed in the surface of the opto-electric compound board 121 so that a desired number of pin units 110 can be mounted thereon. While in the above the opto-electric compound board 121 has been described to be used for the interconnection of the pin unit 110 and the optical fiber cable 124, the opto-electric compound board 121 need not always be employed, in which case the pin unit 110 and the optical fiber cable 124 may be interconnected via an optical connector that is mounted in the surface of the electric wiring layer. Alternatively, the optical fiber cable 124 and the electric cable 125 may be connected directly to the pin unit 110 by connecting an optical connector and an electric connector to the end portions of the optical fiber cable 124 and the electric cable 125, respectively.

Reference numeral 128 in FIG. 7 denotes a cooling frame which mechanically supports the pin unit 110 and at the same time has a function of cooling it. The cooling frame 128 has a number of unit housing holes 128A, which are each surrounded, for example, by double-structured walls that define therebetween a passage for cooing water. Reference numerals denote cooling water inlet and outlet ports, respectively.

On the top end face of the pin unit 110 there are planted upright electric connectors, through which the pin unit 110 is electrically connected to the performance board 101. Incidentally, FIG. 7 shows the case where plural pin units 110-A are mounted directly on the top of the performance board 101 with a view to minimizing the length of electric wiring for their connection to IC devices under test; hence, this configuration is particularly suitable for testing high-speed IC devices.

Figure 9:
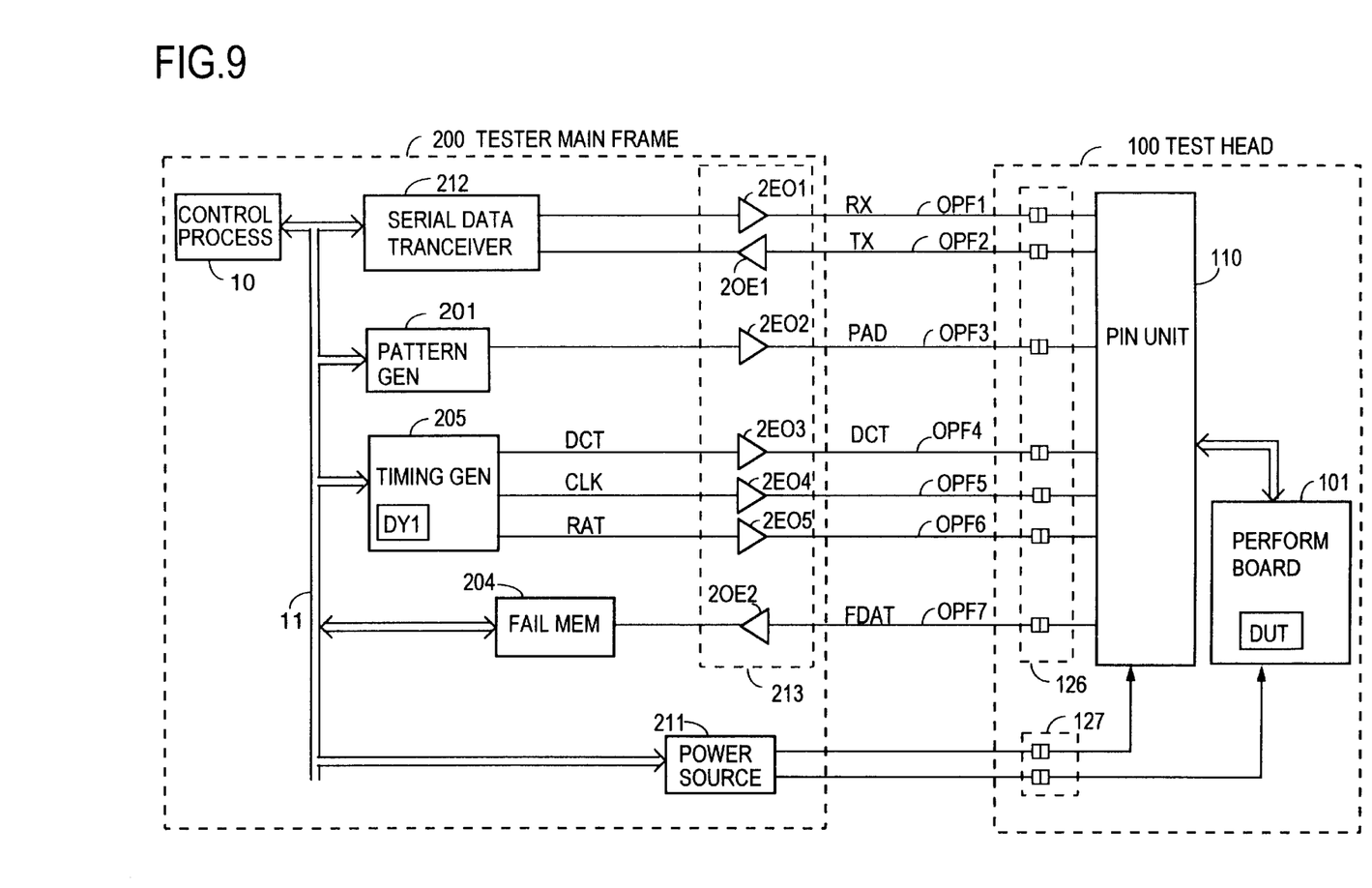
FIG. 9 is a block diagram illustrating another embodiment of the present invention.

FIG. 9 illustrates another embodiment of the present invention. In this embodiment the formatter 202 and the logic comparator 203 provided in the tester mainframe 200 in the FIG. 4 embodiment are removed therefrom to the test head 100 to eliminate the need for exchanging the strobe signals between the tester mainframe 200 and the test head 100 and hence reduced the number of optical fibers used correspondingly. Accordingly, pattern data PAD generated by the pattern generator 201 is converted by the electro-optic converter 2EO2 into an optical signal, which is applied via the optical fiber OPF3 to the pin unit 110 of the test head 100, and in a waveform or format controller 130 shown in FIG. 10 the test pattern signal of a real waveform is generated from the pattern data PAD and applied to the DUT. The response signal from the DUT is compared with an expected value in the pin unit 110 and the comparison results (failure data) FDAT are converted into an optical signal, which is sent over the optical fiber OPF7 to the mainframe 200, wherein it is written in the failure memory 204 after being converted by the opto-electric converter 2OE2 into an electric signal.

Fine control of the delay time for the timing generator 205 in FIG. 4, which is shorter than the clock period, is effected at the test head side. The timing generator 205 generates the clock signal CLK, the rate signal RATE subjected to delay control in units of the clock period and fine delay control data DCT for fine delay control, which are converted by the electro-optic converters 2EO4, 2EO5 and 2EO3 into optical signals, and these optical signals are supplied to the test head 100 via the optical fibers OPF5, OPF6 and OPF4.

Figure 10:
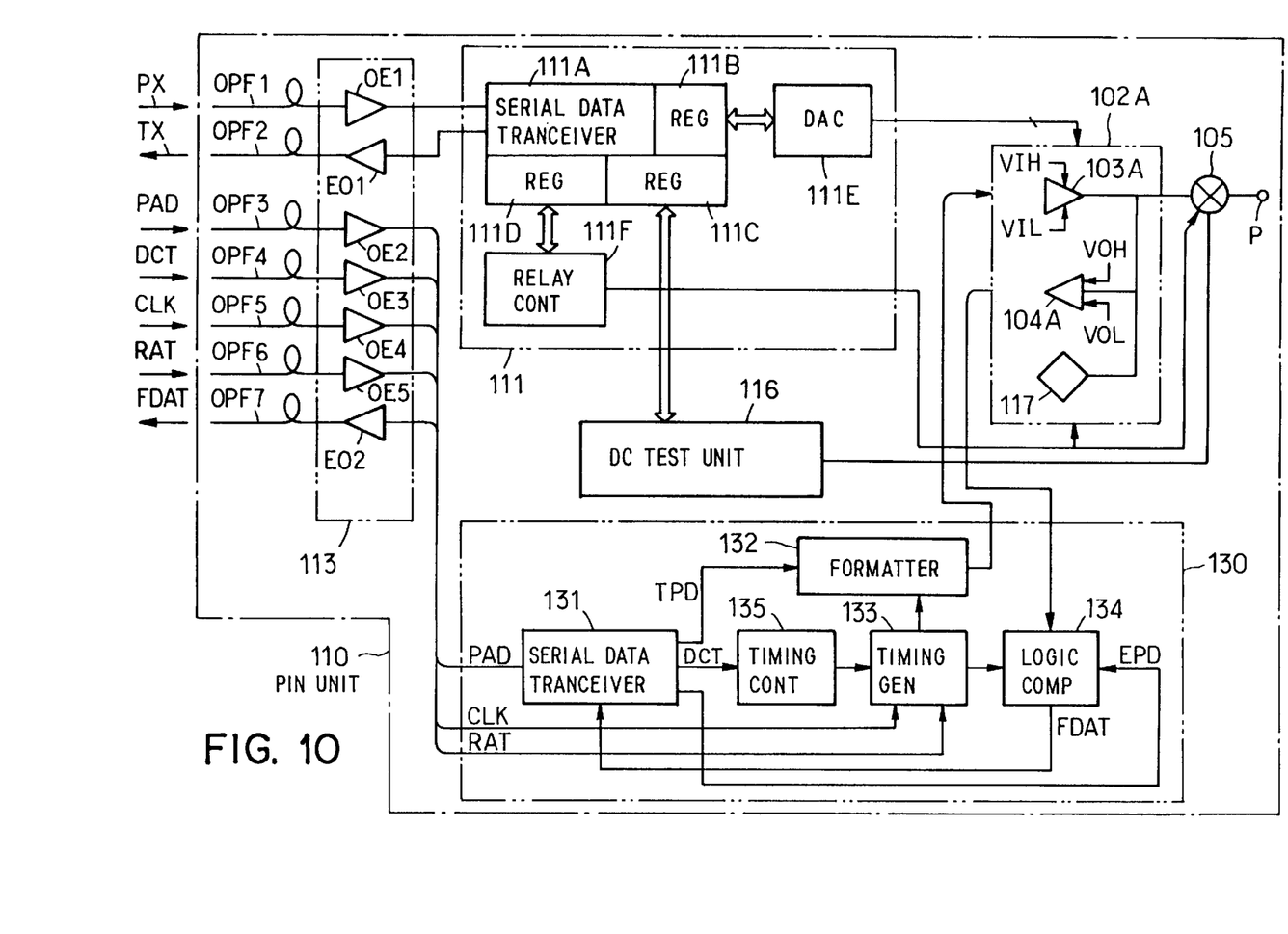
FIG. 10 is a block diagram showing an example of the pin unit structure in the embodiment of FIG. 9.

As shown in FIG. 10, the test head 100 is provided with the waveform or format controller 130 as well as the local pin controller 111 and the DC test unit 116 and is so configured as to generate a pattern signal and perform a logical comparison operation by the format controller 130. That is, the format controller 130 is also provided with a serial data transceiver 131, which receives a serial signal of the test pattern data PAD sent over the optical fiber OPF3 from the pattern generator 201 (FIG. 9) and applies it to the formatter 132, wherein a pattern signal of an analog waveform is generated.

With a view to avoiding upsizing of the test head 100, only the fine delay circuit DY1, referred to previously with reference to FIG. 1, is removed from a timing generator 133 to the test head side to reduce the circuit scale of the timing generator 133 in the test head 100. Accordingly, in this example the rate pulse, coarsely delayed by the coarse delay circuit DY1 in units of the clock period at the tester mainframe 200, is converted by the electro-optic converter 2EO5 into an optical signal and this optical rate pulse RATE is sent over the optical fiber OPF4 to the pin unit 110. This optical signal is converted by the opto-electric converter OE3 into the rate pulse RATE and applied as an electric rate pulse RATE to the timing generator 133, wherein it is finely delayed and distributed therefrom as timing signal to respective parts. The fine delay control data DCT is input into a timing controller 135 from the optical fiber OPF5 via the serial data transceiver 131. The fine delay control data DCT is used to control the timing generator 133 by the timing controller 135.

A logic comparator 134 makes a logical comparison between the test pattern data PAD (a digital signal) input into the formatter 132 and the response signal from the DUT and sends the comparison result as a failure signal FDAT to the serial data transceiver 131, from which it is sent to the electro-optic converter EO5 for conversion into an optical signal, which is sent over the optical fiber OPF7.

Figure 11:
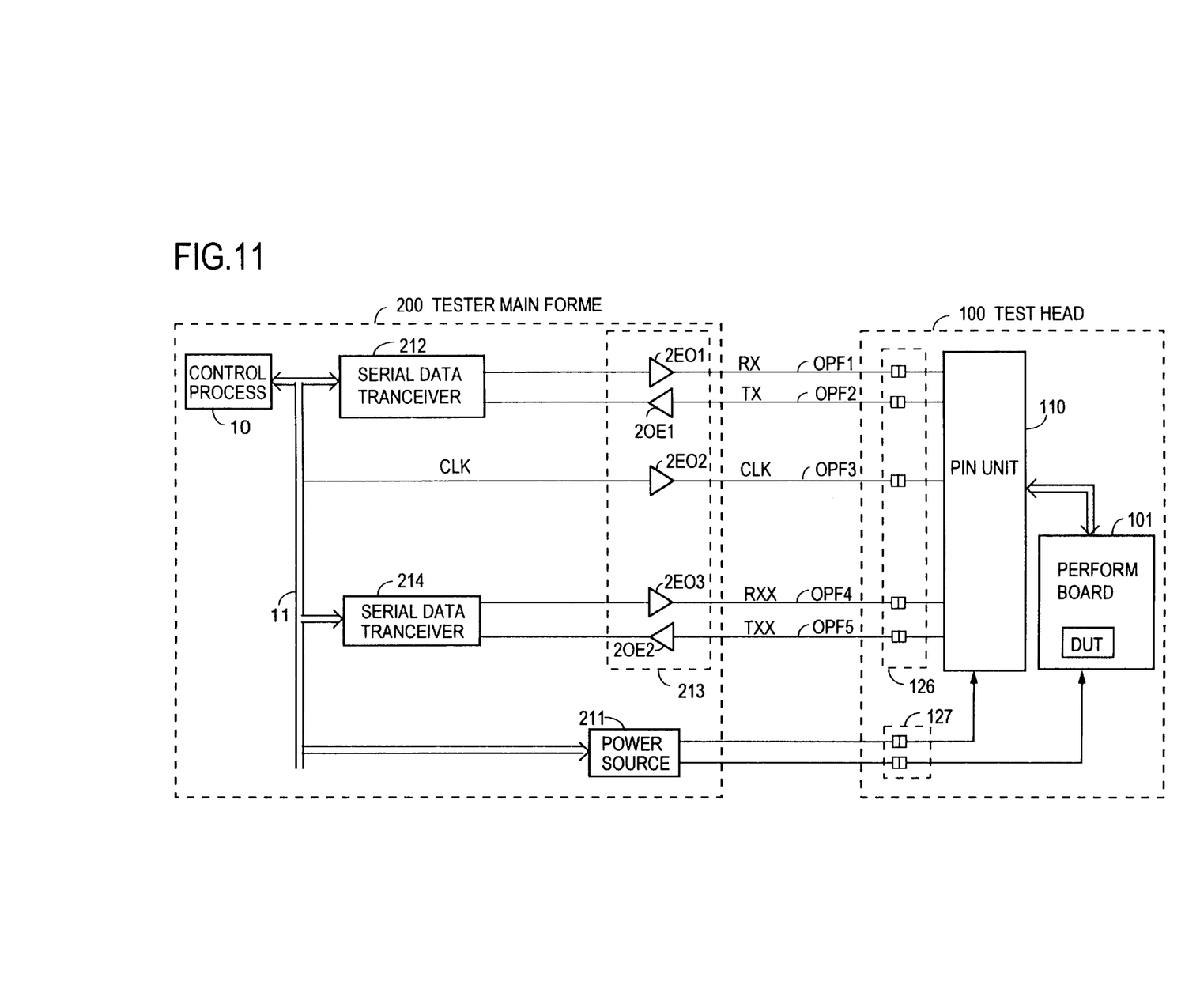
FIG. 11 is a block diagram illustrating still another embodiment of the present invention.

FIG. 11 illustrates in block form still another embodiment of the present invention. In this embodiment the pattern generator 201, the failure memory 204 and the timing generator 205 are further removed to the test head side in the FIG. 9 embodiment and a serial data transceiver 214 is added to the tester mainframe 200 and is so configured as to transmit data necessary for pattern generation via the optical fiber OPF4 and receive the test results via the optical fiber OPF5. With this configuration, the total number of optical fibers used is smaller than in the FIG. 9 embodiment.

Figure 12:
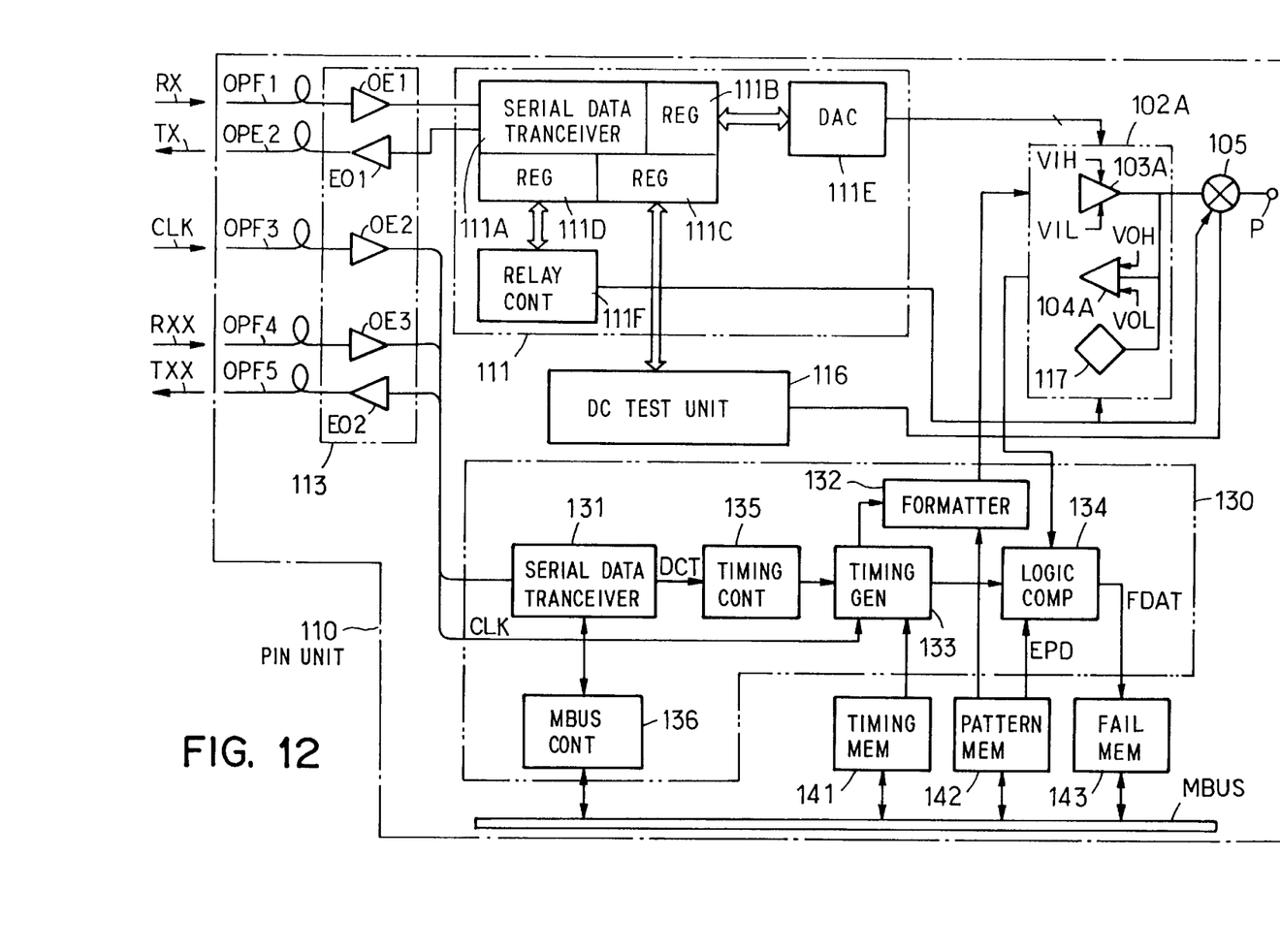
FIG. 12 Is a block diagram showing an example of the pin unit structure in the embodiment of FIG. 11.

With the view of generating a pattern signal at the test head side, the pin unit 110 of the test head 100 in this embodiment is provided, as depicted in FIG. 12, with a timing memory 141, a pattern memory 142 and failure memory 143 in association with the format controller 130.

The serial data transceiver 214 sends, in advance, pattern data RXX as a serial signal via the optical fiber OPF4 to the pattern memory 142 for storage therein. Furthermore, the serial data transceiver 214 utilizes an idle time to send the delay control data (timing data) DCT via the optical fiber OPF5 to the timing memory 141 for storage therein. Hence, prior to the start of test, data for all terminals of the DUT is sent from the tester mainframe 200 to the respective pin units 110 provided in the test head 100 for storage.

At the same time as the test starts, the pattern data PAD is read out from the pattern memory 142 and is provided to the formatter 132 for conversion into a pattern signal of an analog waveform. The delay control data DCT is also read out of the timing memory simultaneously with the readout of the pattern data PAD and is provided to the timing generator 133, wherein the rate signal RATE representative of the test period is generated from the clock signal CLK. The rate signal RATE is delayed by very short time intervals corresponding to the delay control data DCT to produce various timing signals, which are applied to the formatter 132, the analog comparator 104A and the logic comparator 134, thereby defining the timing for respective comparison, the timing for rise and fall of the pattern signal, and so forth.

Upon each detection of a mismatch by the logic comparator 134, a signal of H logic, for instance, which represents a failure, is written in the failure memory 143 at a failure occurrence address. In an idle time during the test or at the end of the test, the failure data (test results) thus stored in the failure memory 143 is sent via a memory bus MBUS and the serial data transceiver 131 to the electro-optic converter EO2 for conversion into an optical signal TXX, which is sent over the optical fiber OPF5 to the tester mainframe 200.

Effect of the Invention

As described above, according to the present invention, the data, clock and other signals, which are exchanged between the tester mainframe 200 and the test head 100, are all transmitted over optical fibers. The diameter of such an optical fiber is approximately 500 m$\mu\phi$ at the largest and is sufficiently smaller than the electric cable. Accordingly, even if the number of optical fibers used is the same as the number of conventional electric cables, the bundle of optical fibers is smaller in diameter than the bundle of electric cables. Furthermore, since the optical fibers are lighter than the electric cables, the bundle of optical fibers is lightweight and easy to handle.

By using the serial data transceivers 111A and 131 as shown in FIG. 9 or 11, the number of cables used can be reduced. In particular, the provision of the pattern memory 142, the timing memory 141 and the failure memory 143 as depicted in FIG. 11 makes it possible to transmit different signals over common optical fibers. Hence, the number of optical fibers used for each terminal of the DUT can be reduced down to about six as shown in FIG. 11. This leads to reduction of the diameter of the cable group 300 that interconnects the tester mainframe 200 and the test head 100.

Since the optical fiber does not much attenuate light and is free from leakage of light, it is possible to keep the tester mainframe 200 and the test head 100 separated far apart. Accordingly, the tester mainframe 200 that generate a large amount of heat can be placed in a room different from that where the test head 100 is placed, or only the test head 100 can be disposed in a clean room, for instance. Besides, since optical signals are used to exchange various signals, there is not need of providing a terminating resistor in each signal transmission line. This also present an advantage of offering a tester of small heat generation.

It will be apparent that many modifications and variations may be effected without departing from the scope of the novel concepts of the present invention.

What is claimed is:

1. An integrated circuit device tester which, under the control of a control processor, generates pattern data and expectation data by a pattern generator, formats said pattern data by a formatter into a predetermined pattern waveform, applies said pattern waveform by a driver to an IC device under test at a reference voltage, compares a response signal from said IC device under test by an analog comparator with a reference logical level to make a logical decision, compares the decided logic by a logic comparator with expectation data from said pattern generator to decide whether or not said IC under test is defective or nondefective, and writes failure data in a failure memory, said IC device tester comprising:

a tester mainframe provided with said control processor;

first serial data transceiver means provided in said tester mainframe, for outputting data, as serial data, which is used to set said reference voltage for said driver and said reference logical level for said analog comparator;

electro-optic converter means provided in said tester mainframe, for converting said serial data to an optical signal;

a test head provided with said driver for applying a test pattern to said IC device under test and an analog comparator for deciding the logic of its response;

opto-electric converter means provided in said test head, for converting said optical signal to serial data of an electric signal;

second serial data transceiver means provided in said test head, for converting said serial data to parallel reference voltage data and parallel reference logical level data;

D/A converter means provided in said test head, for converting said parallel reference voltage data and said parallel reference logical level data to an analog reference voltage and a reference logical level and for setting them in said driver and said analog comparator, respectively; and optical fiber means for interconnecting said electro-optic converter means and said opto-electric converter means.

2. The tester of claim 1, wherein said second serial data transceiver means includes register means for holding received serial data and outputting it as various setting parallel data.

3. The tester of claim 2, which further comprises a DC test unit in said test head and in which a control signal to said DC test unit is transmitted as an optical serial signal from said tester mainframe to control said DC test unit to conduct a DC test of said IC device under test.

4. The tester of claim 3, wherein said second serial data transceiver means stores data set for each terminal and DC test results in said register means of said test head and transmits said set data and said DC test results as optical serial signals to said tester mainframe.

5. The tester of claim 4, wherein a pattern signal to be applied to said IC device under test is fed as an optical signal for each terminal of said IC device under test from said tester mainframe to said test head and is applied to said IC device under test via said driver provided in said test head; a signal read out of said IC device under test is checked by said analog comparator to decide whether it has a normal H- or L-logic voltage; and the decision result is converted by said electro-optic converter means into an optical serial signal for said each terminal of said IC device under test and sent via said optical fiber means to said tester mainframe.

6. The tester of claim 3, wherein third serial data transceiver means, said formatter and said logic comparator are provided in said test head in correspondence with each terminal of said IC device under test; digital pattern data is sent as a optical serial signal for said each terminal from said tester mainframe to said test head and is received and converted therein by said third serial data transceiver means to parallel pattern data; said parallel pattern data is converted by said formatter to an analog pattern signal; said pattern signal is applied via said driver to said each terminal; a signal read out of said IC device under test is checked by said analog comparator to decide whether its logical level is normal or not; the decision result is subjected to a logical comparison by said logic comparator with digital expectation pattern data from said tester mainframe; and the logical comparison result is sent as an optical serial signal to said tester mainframe via said third serial data transceiver means.

7. The tester of claim 6, wherein said test head is provided with a timing generator; digital timing data sent as an optical serial signal is provided to said timing generator after being converted by said third serial data transceiver means to parallel signals; and operations of said formatter, said logic comparator and said analog comparator are controlled following a timing signal from said timing generator.

8. The tester of claim 3, wherein said test head is provided with a pattern memory, a failure memory and a timing memory; pattern data and timing data sent as optical signals from said tester mainframe to said pattern memory and said timing memory are prestored therein; at the same time as a test start, said pattern data and said timing data are read out from said pattern memory and said timing memory and provided to said formatter and said timing generator to generate therefrom a pattern signal and a timing signal; a functional test of said IC device is conducted using said pattern signal and said timing signal; the results of said functional test are obtained by said logic comparator and stored in said failure memory; and said stored data is sent as an optical signal to said tester mainframe.

9. An integrated circuit device tester which, under the control of a control processor, generates pattern data and expectation data by a pattern generator, formats said pattern data by a formatter into a predetermined pattern waveform, applies said pattern waveform by a driver to an IC device under test at a reference voltage, compares a response signal from said IC device under test by an analog comparator with a reference logical level to make a logical decision, compares the decided logic by a logic comparator with expectation data from said pattern generator to decide whether or not said IC under test is defective or nondefective, and writes failure data in a failure memory, said IC device tester comprising:

a tester mainframe provided with said control processor, said pattern generator, said formatter, said logic comparator and said failure memory;

first electro-optic converter means provided in said tester mainframe, for converting an output test pattern waveform from said formatter to an optical signal;

a test head provided with said driver and said analog comparator;

first opto-electric converter means provided in said test head, for converting a test pattern waveform provided thereto as an optical signal into a test pattern waveform of an electric signal and for applying it to said driver;

second electro-optic converter means provided in said test head, for converting the result of comparison by said analog comparator into an optical signal;

second opto-electric converter means provided in said tester mainframe, for converting said comparison result provided thereto as said optical signal into an electric signal and for applying it to said logic comparator;

first optical fiber means interconnecting the output of said second electro-optic converter means and the input of said first opto-electric converter means, for transmitting a test pattern optical signal from the former to the latter;

second optical fiber means interconnecting the output of said second electro-optic converter means and the input of said second opto-electric converter means, for transmitting a comparison-result optical signal from the former to the latter;

first serial data transceiver means provided in said tester mainframe, for outputting, as serial data, data for setting said reference voltage for said driver and said reference logical level for said analog comparator;

third electro-optic converter means provided in said tester mainframe, for converting said serial data to an optical signal;

third opto-electric converter means provided in said test head, for converting said optical signal to serial data of an electric signal;

second serial data transceiver means provided in said test head, for receiving said serial data and outputting it as parallel reference voltage data and as parallel reference logical level data;

D/A converter means provided in said test head, for converting said parallel reference voltage data and said parallel reference logical level data to an analog reference voltage and an analog reference logical level and for setting them in said driver and said analog comparator, respectively; and third optical fiber means interconnecting said third electro-optic converter means and said third opto-electric converter means.

10. The tester of claim 9, wherein said second serial data transceiver means includes register means for holding received serial data and for outputting it as parallel data for various setting.

11. The tester of claim 10, which further comprises a DC test unit in said test head and in which a control signal to said DC test unit is transmitted as an optical serial signal from said tester mainframe to control said DC test unit to conduct a DC test of said IC device under test.

12. The tester of claim 11, wherein said second serial data transceiver means stores data set for each terminal of said IC device under test and DC test results in said register means of said test head and transmits said set data and said DC test results as optical serial signals to said tester mainframe.

13. The tester of claim 3, 4, 11, or 12, which further comprises a relay matrix provided in said test head, for selectively connecting the output of said driver and the output of said DC test unit to said IC device under test.

* * * * *